United States Patent [19]

Basol

[11] Patent Number: 4,666,569

[45] Date of Patent: May 19, 1987

[54] METHOD OF MAKING MULTILAYER OHMIC CONTACT TO THIN FILM P-TYPE II–VI SEMICONDUCTOR

[75] Inventor: Bulent M. Basol, Los Angeles, Calif.

[73] Assignees: Standard Oil Commercial Development Company, Cleveland, Ohio; BP Solar International Ltd., London, England

[21] Appl. No.: 869,545

[22] Filed: Jun. 2, 1986

Related U.S. Application Data

[62] Division of Ser. No. 687,092, Dec. 28, 1984.

[51] Int. Cl.$^4$ .................... C25D 7/12; C25D 5/50; C23C 14/24; H01L 21/443
[52] U.S. Cl. .................... 204/34.5; 29/572; 29/589; 29/590; 204/37.1; 204/40; 427/88; 427/89; 427/91; 136/256; 136/260; 136/264
[58] Field of Search .................... 29/572, 590, 589; 427/74, 76, 88, 89, 91; 204/34.5, 40, 37.1; 136/256, 260, 264, 265; 357/71

[56] References Cited

U.S. PATENT DOCUMENTS

| | | | |
|---|---|---|---|
| 3,268,309 | 8/1966 | Frank et al. | 428/620 |
| 3,370,207 | 2/1968 | Fabel et al. | 357/71 |
| 3,465,428 | 9/1969 | Spriggs et al. | 29/589 |
| 4,000,508 | 12/1976 | Hager et al. | 357/61 |
| 4,065,781 | 12/1977 | Gutknecht | 357/23 |
| 4,085,500 | 4/1978 | Hager et al. | 29/589 |
| 4,388,483 | 6/1983 | Basol et al. | 136/260 |
| 4,456,630 | 6/1984 | Basol | 427/88 |
| 4,463,215 | 7/1984 | Bassett et al. | 136/244 |

FOREIGN PATENT DOCUMENTS 55-1151  1/1980  Japan .................. 357/30 B

OTHER PUBLICATIONS

H. Jaeger et al, *J. Electronic Mat'ls*, vol. 10, No. 3, May 1981, pp. 605–618.
*NASA Tech. Briefs*, Winter 1977, p. 433.
Böer et al., "P-Type Photoelectric Behavior in CdS Dominated by a High Resistivity Region Near the Anode" *Phys. Rev.*, vol. 154, pp. 757–762 (1967).

*Primary Examiner*—Aaron Weisstuch
*Attorney, Agent, or Firm*—Joseph G. Curatolo; Larry W. Evans

[57] ABSTRACT

A method of making an ohmic content to a thin film of a II–VI compound semiconductor. The contact is made by etching the film with an acidic solution and thereafter treating the etched surface with an alkaline solution. A layer of copper 5 to 50 angstroms thick is deposited on the etched and treated surface and covered by a different metal. The contact may be heat treated to improve its performance.

6 Claims, 3 Drawing Figures

METHOD OF MAKING MULTILAYER OHMIC CONTACT TO THIN FILM P-TYPE II-VI SEMICONDUCTOR

This is a division of application Ser. No. 687,092 filed Dec. 28, 1984.

FIELD OF THE INVENTION

This invention relates to materials and methods for forming ohmic contacts with a thin film of a p-type semiconductor compound, which film comprises at least one of the metal elements of Class IIB of the Periodic Table of Elements and one of the non-metal elements of Class VIA of the Periodic Table of Elements. Such thin films and ohmic contacts find applications in thin film photovoltaic devices.

BACKGROUND OF THE INVENTION

The commercialization of photovoltaic devices, devices capable of directly converting radiant energy into electrical energy is dependent on technological advances that contribute to improving the conversion efficiencies and stability of such devices. Several different approaches have been taken toward the development of photovoltaic devices, these approaches being directed towards the development of crystalline, polycrystalline, and amorphous semiconducting materials for photovoltaic uses. Each type of material has presented unique technical difficulties that need to be overcome.

Among the polycrystalline semiconducting materials that are preferred for photovoltaic devices are p-type Class IIB-VIA semiconductor compounds that may be provided as thin films. Cadmium telluride and mercury cadmium telluride are examples of such compounds. However, it is difficult to establish ohmic contact with such compounds because these compounds do not readily form into layers having very low resistivity, and tunnelling junctions are required for ohmic contacts. For use in photovoltaic devices a low resistance ohmic contact is necessary for efficient energy conversion.

To make an ohmic contact with a p-type Class 11B-VIA semiconductor and an electrically conductive metal, the p-type Class 11B-ViA semiconductor is etched with an acidic solution. then a suitable metal is deposited on the etched semiconductor surface. Acidic solutions commonly used for etching include $H_2SO_4 + K_2Cr_2O_7 + H_2O$; $HNO_3 + K_2Cr_2O_7 + H_2O$; $HNO_3 + K_2Cr_2O_7 + AgNO_3 + H_2O$; $HF + H_2O_2 + H_2O$; $HF + HNO_3 + H_2O$; $HNO_3 + H_2O$; and bromine-methanol.

It is believed that the acidic etch produces a surface rich in Class VIA element, which improves the electrical contact between the metal to be deposited and the p-type Class IIB-VIA semiconductor material Such acidic etchings have been used to improve the ohmic contact between the metal to be deposited and low resistivity, single crystal p-type semiconductors.

However, when the Class IIB-VIA semiconductor is provided as a polycrystalline thin film, generally having a thickness of less than 10 micrometers, then other factors become significant. These thin films possess relatively high resistivities, that is, a resistivity greater than about 100 ohm-centimeters as compared to much lower values in a single crystal counterpart material. Typical resistivity values for a thin film of cadmium telluride, for example, one about $10^4$ ohm-cm. Strong acidic etches used for single crystal materials are too uncontrolled and abrasive for use on thin films, with the exception of very dilute bromine methanol, on the order of approximately 0.1 percent bromine in methanol. Applicant has disclosed an improved method of forming ohmic contacts between thin film p-type Class IIB-VIA semiconductor compounds and a conductive metal layer in U.S. Pat. No. 4,456,630, which disclosure is incorporated herein by reference. In this method, a thin film of a p-type Class IIB-VIA semiconductor compound is etched with an acidic solution, preferably an oxidizing acidic solution, then treated with a strong basic solution and finally a conductive metal layer is deposited on the etched and treated surface of the semiconductor.

Whereas these earlier-mentioned methods sought to improve the ohmic contact between a conductive metal layer and a p-type semiconductor compound, little consideration was given to the economic feasibility of these improvements. As an example, the most preferred conductive metal layer which forms an ohmic contact to these semiconductor compounds is gold. Such use of gold is not a viable alternative in the commercial production of low cost photovoltaic devices.

What is needed in the area of forming ohmic contacts between p-type thin films and conductive metals is a further improvement to produce a stable, and economically feasible ohmic contact.

It is therefore one object of the present invention to provide stable, economically feasible ohmic contacts between p-type semiconductor thin films and conductive metals.

It is a further object of the present invention to provide a method for forming such ohmic contacts.

These and other objects of the present invention will become apparent to those skilled in the art in the following description of the invention and in the appended claims.

SUMMARY OF THE INVENTION

In general, the invention relates to an ohmically conductive contact for a thin film p-type semiconductor compound formed of at least one of the metal elements of Class IIB of the Periodic Table of Elements and at least one of the non-metal elements of Class VIA of the Periodic Table of Elements comprising a first layer of copper contiguous with the p-type semiconductor compound and having a thickness of from about 5 Angstroms to about 50 Angstroms and a second layer thereon comprising at least a second conductive metal.

The invention also relates to a method of forming ohmic contacts between a p-type thin film semiconductor compound formed of at least one of the metal elements of Class IIB of the Periodic Table of Elements and one of the non-metal elements of Class VIA of the Periodic Table of Elements and a conductive metal, which method comprises:

(a) etching the surface of the film with an acidic solution to form a non-metal-rich surface;
(b) treating the surface of the acid-etched film with a strong basic solution;
(c) depositing on the etched and treated surface a layer of copper having a thickness of from about 5 Angstroms to about 50 Angstroms; and
(d) then depositing on the copper layer a conductive metal layer comprising at least a second conductive metal.

The present invention also includes a method of forming ohmic contacts in accordance with the above process wherein the above method additionally comprises:

(e) heat treating the deposited layers at a temperature of between about 80° C. and about 250° C. to anneal the deposited layers.

DETAILED DESCRIPTION OF THE INVENTION

As used herein, the phrase "thin film" when referring to Class IIB–VIA semiconductor materials refers to a layer of the semiconductor material having a thickness of from about 0.01 micrometer to about 10 micrometers, and preferably from about 0.5 micrometer to about 2 micrometers.

In accordance with the present invention, there is provided a thin layer of copper in contact with a p-type Class IIB–VIA semiconductor material. This layer is an the order of from about 5 Angstroms to about 50 Angstroms thick. Such a film of copper assures a good tunneling junction (ohmic contact) at the semiconductor surface. The copper layer may be deposited by any known means such as by vapor deposition or electrodeposition. The thickness of the copper layer is such that not enough copper is present to diffuse into the p-type semiconductor layer, as copper is prone to do, and to also cause shorting. Copper is a known dopant for p-type semiconductor materials and will substitute for the Class IIB metal element in a p-type Class IIB-VIA semiconductor. If copper from the deposited layer fully substitutes across the thickness of the Class IIB–VIA semiconductor layer, then any additional copper diffusing into that layer will bridge across the layer producing a short. It becomes evident, therefor, that the use of a copper-only layer is not desirable, since the amount of copper needed to efficiently collect current is also sufficient to produce diffusion and shorting across a Class IIB–VIA thin film. However, it is desirable to utilize copper as it does form a cost-effective, good ohmic contact with Class IIB–VIA semiconductors.

Applicant derives the benefit of a copper ohmic contact by utilizing a layer of copper not exceeding 50 Angstroms in thickness. In this way, an ohmic contact is formed between the Class IIB–VIA thin film; however, there is not enough copper to cause shorting across the thin film. Unfortunately, this thin copper layer is not an adequate current collector. This disadvantage is overcome by the subsequent formation of a layer of a second conductive metal, other than copper, onto the copper layer.

Overlayed onto the copper layer is a second metal layer comprising nickel, gold, silver. antimony, molybdenum, chromium, tellurium, platinum, palladium and mixtures and alloys thereof. Preferably, the second metal layer comprises nickel, gold, chromium, and mixtures and alloys thereof. Most preferably the second metal layer comprises nickel. The metals chosen for the second layer form intimate, stable contacts with the previously deposited thin copper layer. The metals suitable for use as the second metal layer are not suitable for substitution of the copper layer because they do not form as good an ohmic contact with the p-type Class IIB–VIA semiconductor layer and/or they are not as economically feasible as the copper layer.

The particular combination of copper/nickel possesses excellent electrical and physical contact with a p-type Class IIB–VIA semiconductor compound and is an economically feasible choice for commercial use. The thickness of the second metal layer is preferably greater than about 1000 Angstroms. The optimum thickness is dependent on the choice of metal or metals for use as the second layer and the area of the device. The second metal layer may be formed by known techniques such as vapor deposition, electrodeposition and the like.

It has also been found in accordance with the present invention that heat treating subsequent to the formation of the copper and second metal layer further improves the electrical contact at this junction. This is due to diffsion of copper into the surface of the p-type Class IIB–VIA semiconductor layers that produces a highly doped surface allowing carrier tunnelling. It is preferred to heat the metal layers at a temperature between about 80° C. and about 250° C. for a time sufficient to anneal the layers.

In order to facilitate understanding of the present invention, reference will now be made to the drawings and to a preferred specific embodiment of the present invention and specific examples thereof. Such examples and drawings should not be construed as limiting the present invention which is properly set forth in the appended claims.

DETAILED DESCRIPTION OF THE DRAWINGS

Figure 1:
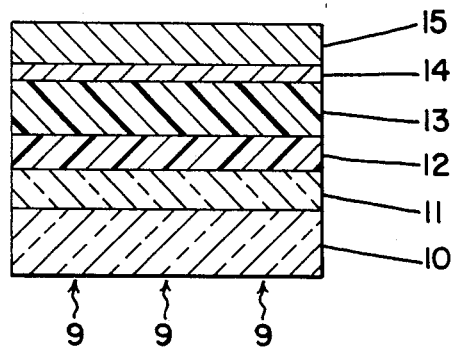
FIG. 1 is a schematic cross-sectional view of the preferred embodiment of a photovoltaic device constructed in accordance with the present invention.

As shown in FIG. 1, the preferred embodiment of the present invention includes a substrate 10 of insulating transparent material such as glass through which radiant energy, shown by arrows 9, enters the photovoltaic device. On substrate 10 is a layer 11 of a conductive transparent material such as indium tin oxide. On layer 11 is deposited a layer 12 of n-type semiconductor material which is different from the thin film semiconductor compound 13 described below. The combination of layers 11 and 12 comprises an n-type wide band window semiconductor substrate different than the film 13 semiconductor compound. On layer 12 is deposited a thin film 13 of a p-type semiconductor compound formed of at least one of the metal elements of Class IIB of the Periodic Table of Elements and one of the non-metal elements of Class VIA of the Periodic Table of Elements. On the surface of film 13 is deposited a layer 14 of copper. Layer 14 possesses a thickness of from about 5 Angstroms to about 50 Angstroms. Layer 15, deposited onto layer 14 is a conductive metal other than copper, such as nickel. The purpose of the present invention is to insure that layer 14 forms a stable ohmic contact with film 13 and that layers 14 and 15 form a stable current collector for the so-described photovoltaic device.

Figure 2:
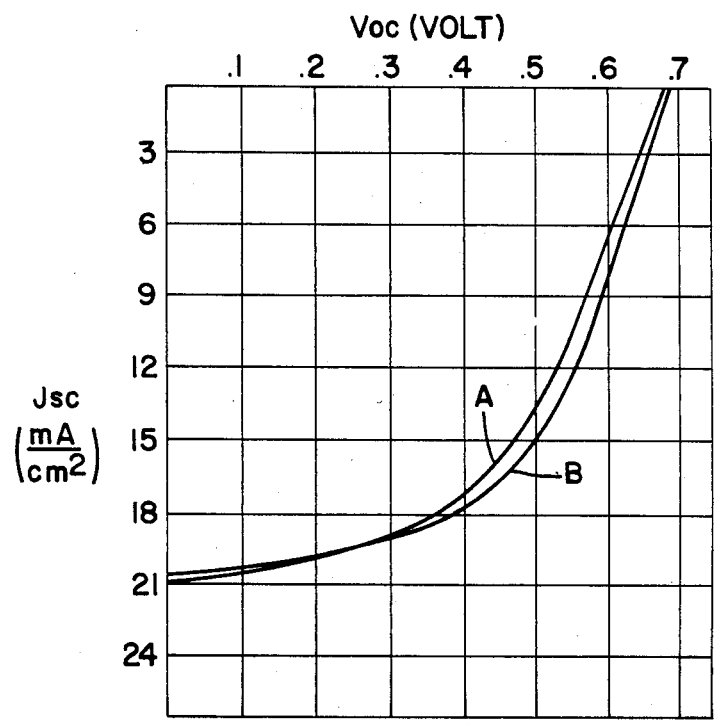
FIG. 2 is a graph of the voltage-current characteristics of a photovoltaic device prepared using the method of the present invention

This embodiment of the present invention and the method of practicing the same can best be described by reference to a specific semiconductor device whose method of construction shall now be described. The method of making the photovoltaic device illustrated in FIG. 1 has been described in detail in Applicant's U.S. Pat. No. 4,388,483 entitled "Thin Film Heterojunction Photovoltaic Cells and Method of Making the Same", which disclosure is incorporated herein by reference. A cadmium telluride film was electrodeposited onto an n-type thin film of cadmium sulfide disposed on a glass substrate that was previously coated with indium tin oxide. The cadmium telluride film had a thickness of about 1.2 micrometers. A film of about 0.4 micrometers thick mercury cadmium telluride was then electroplated on the cadmium telluride. These layers were heat treated as described in the above-identified patent to form a p-type cadmium telluride/mercury cadmium telluride film. A first segment of such film was etched for about two seconds with a solution of one part by volume 98 percent-by-weight $H_2SO_4$ and one part by volume saturated $K_2Cr_2O_7$ solution and then rinsed with deionized water and dried by blowing with nitrogen gas. The cell was then immersed in hydrazine at about room temperature for about 10 minutes and then rinsed with deionized water and blow-dried with nitrogen. Next a layer of about 20 Angstroms thick copper was evaporated onto the surface of the film, followed by the vapor deposition of an about 1400 Angstrom thick nickel layer. The resulting photovoltaic device was measured before and after an about 65 hour heat treatment at about 85° C. in air, with the results being displayed in FIG. 2. Curve A is the voltage/current characteristics of the device before heat treating and Curve B is the voltage/current characteristics of the device after heat treating. It is observed that as a result of the heat treatment the fill factor and efficiency of the cell increased by about four percent and about three percent respectively, and the overall cell efficiency increased from about 7.1 percent to about 7.3 percent.

Figure 3:
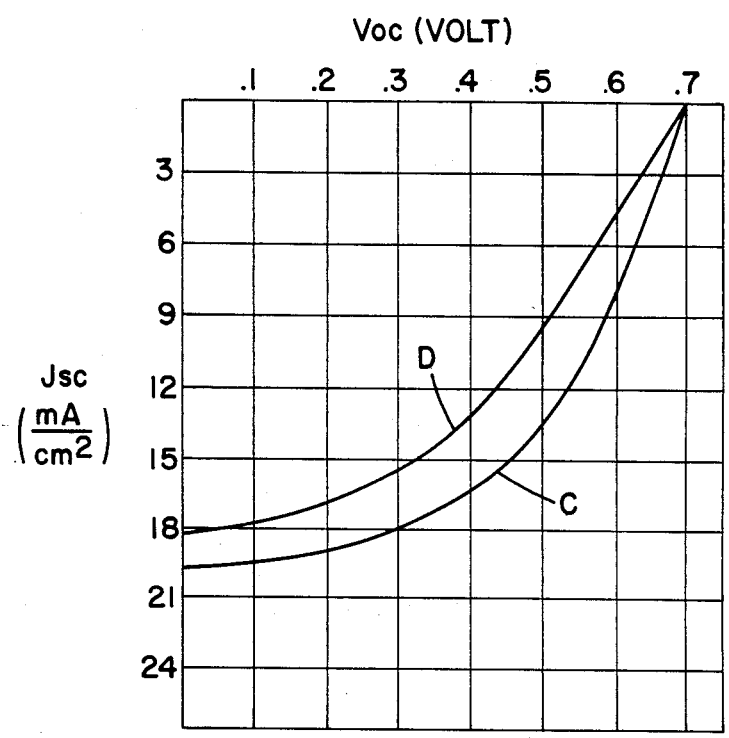
FIG. 3 is a graph of the voltage-current characteristics of a photovoltaic device not prepared in accordance with the present invention.

As a comparison with the ohmic contact of the present invention, a second segment of the p-type cadmium telluride/mercury cadmium telluride film was etched, treated, and dried as described above, then a first conductive metal layer of titanium, about 88 Angstroms thick, and a second conductive metal layer of nickel, about 1400 Angstroms thick, were vapor deposited onto the prepared film. This device was measured concurrently with the above-described photovoltaic device made in accordance with the invention described herein. The results of testing at 85° C. are displayed in FIG. 3. Curve C is the voltage/current characteristics of the device prior to heat treating and Curve D is the voltage/current characteristics of the device after heat treating. In this example the fill factor decreased by about sixteen percent and overall efficiency by about twenty-four percent. The end result was a cell having an overall efficiency of about 5.2 percent.

Third and fourth segments of p-type films were also etched, treated with a base solution, and dried as described above, then nickel layers, 1000 Angstroms and 1500 Angstroms respectively, were vapor deposited onto the prepared film segments. These photovoltaic devices were measured in the same fashion, and concurrently with, the above-described device made in accordance with the subject invention. The results of testing these devices indicated that the copper/nickel back contacts were superior to nickel-only back contacts.

Similar experiments were also conducted with a p-type semiconductor layer that comprised mercury cadmium telluride. These devices were prepared as cadmium sulfide/mercury cadmium telluride devices in accordance with Applicant's co-pending U.S. patent application Ser. No. 576,559 (now U.S. Pat. No. 4,548,681) entitled "Thin Film Heterojunction Photovoltaic Device that Utilize Cd Rich HgCdTe and Method of Electrodeposition of Same."

After the film of mercury cadmium telluride was deposited onto a cadmium sulfide n-type layer the mercury cadmium telluride layer was heat treated as described in the above identified patent application to form a p-type mercury cadmium telluride film. The film was etched for about 2 seconds with a solution of 1 part by volume 98 percent-by-weight $H_2SO_4$ and 1 part by volume saturated $K_2Cr_2O_7$ solution and then rinsed with deionized water and dried by blowing with nitrogen gas. The cell was then immersed in hydrazine at about room temperature for about 10 minutes and then rinsed with deionized water and dried with nitrogen. Next a layer of about 20 Angstroms thick copper was evaporated onto the surface of the film, followed by the vapor deposition of a nickel layer about 1400 Angstroms thick. The resulting photovoltaic device was measured before and after a heat treating step, wherein the device was heat treated at about 105° C. for about 30 minutes.

The performance of such cadmium sulfide/mercury cadmium telluride photovoltaic devices before and after heat treating can be ascertained from Table 1 below, which lists the open circuit voltage, short circuit current, fill factor and overall efficiency for such cells.

TABLE 1

|  | CdS/HgCdTe Cells Having Cu/Ni Back Contacts: No Heat Treatment | CdS/HgCdTe Cells Having Cu/Ni Back Contacts: Heat Treated at 105° C. |
| --- | --- | --- |
| Open Circuit Voltage ($V_{oc}$) (Volt) | 0.5 | 0.65 |
| Short Circuit Current ($J_{sc}$) (mA/cm$^2$) | 26.5 | 28.0 |
| Fill Factor (F.F.) | 0.51 | 0.62 |
| Overall Efficiency (Percent) | 6.8 | 9.55 |

It is to be noted that similar results can be obtained when heat treating is done in other fashions recognized in the art, as for example by heat treating in a vacuum while the copper/nickel contact is being deposited.

There are many features in the present invention which clearly show the significant advantage which the present invention achieves over the prior art. Consequently, only a few of the more outstanding features will be pointed out to illustrate the unexpected and unusual results obtained by the present invention. One feature is that conventional back contacts of only one conductive metal layer generally result in a substantial resistance between the metal layer and the p-type semiconductor layer. It is necessary that a first, thin copper layer be used to achieve the stable ohmic contact of the present invention. Another feature of the present invention is that although a copper layer is used to form an ohmic contact with the Class IIB–VIA semiconductor compound, a copper-only contact does not produce a lasting, stable ohmic contact. Consequently, it is the unique combination of a first thin layer of copper and a second layer of a conductive metal other than copper which yield the desired result.

It should be apparent to those skilled in the art that the subject invention accomplishes the objects set forth above. It will be understood that the foregoing description is only illustrative of the present invention and is not intended that the invention be limited thereto. The selection of deposition processes, Class IIB–VIA semiconductor materials, layer thicknesses, and choice of conductive metal layers can be determined from the Specification provided without departing from the spirit of the invention herein disclosed and described. The scope of the invention includes equivalent embodiments, modifications and variations that fall within the scope of the attached claims.

What is claimed is:

1. A method of forming an ohmic contact to a thin film of a p-type semiconductor compound formed of at least one of the metal elements of Class IIB of the Periodic Table of Elements and one of the non-metal elements of Class VIA of the Periodic Table of Elements, comprising:
   (a) etching the surface of a thin film of a p-type semiconductor compound formed of at least one of the metal elements of Class 11B of the Periodic Table of Elements and one of the non-metal elements of Class VIA of the Periodic Table of Elements with an acidic solution to form a non-metal-rich surface;
   (b) treating the surface of the acid-etched film with a strong basic solution;
   (c) depositing on said etched and treated surface a layer of copper metal having a layer thickness of from about 5 Angstroms to about 50 Angstroms; and
   (d) depositing on said copper layer a layer of a different metal.

2. The method in accordance with claim 1 wherein said depositing of said copper layer and said layer of conductive metal is performed by vapor depositing.

3. The method in accordance with claim 1 wherein said depositing of said copper layer and said layer of conductive metal is performed by electrodepositing.

4. The method in accordance with claim 1 wherein said method additionally comprises:
   (e) heat treating said deposited layers so as to anneal said layers.

5. The method in accordance with claim 4 wherein said layers are heat treated at a temperature between about 80° C. and 250° C.

6. The method in accordance with claim 1 wherein said different metal is selected from the group consisting of nickel, gold, silver, molybdenum, chromium, platinum, palladium, and mixtures and alloys thereof.

* * * * *